US012563896B2

(12) United States Patent
Hou et al.

(10) Patent No.: US 12,563,896 B2
(45) Date of Patent: Feb. 24, 2026

(54) DISPLAY SUBSTRATE, DISPLAY PANEL, DISPLAY DEVICE AND MANUFACTURING METHOD OF DISPLAY PANEL

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Rui Hou, Beijing (CN); Yulin Wang, Beijing (CN); Jiandong Bao, Beijing (CN); Zhen Li, Beijing (CN); Pengcheng Zhao, Beijing (CN); Le Chang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 750 days.

(21) Appl. No.: 17/267,146

(22) PCT Filed: May 9, 2020

(86) PCT No.: PCT/CN2020/089413

§ 371 (c)(1),
(2) Date: Feb. 9, 2021

(87) PCT Pub. No.: WO2021/226750

PCT Pub. Date: Nov. 18, 2021

(65) Prior Publication Data

US 2022/0115452 A1     Apr. 14, 2022

(51) Int. Cl.
*H10K 59/121* (2023.01)
*H10K 59/122* (2023.01)
(Continued)

(52) U.S. Cl.
CPC ......... *H10K 59/121* (2023.02); *H10K 59/122* (2023.02); *H10K 59/124* (2023.02);
(Continued)

(58) Field of Classification Search
CPC ........ H10K 59/873–8731; H10K 59/12–1315; H10K 77/111; H10K 2102/311;
(Continued)

(56) References Cited

U.S. PATENT DOCUMENTS 10,879,491 B1    12/2020   Yoo et al.
2009/0212694 A1    8/2009   Cok
(Continued)

FOREIGN PATENT DOCUMENTS

CN        2005055713 A        3/2005
CN        107068905 A        8/2017
(Continued)

OTHER PUBLICATIONS

Non-Final Office Action, U.S. Appl. No. 17/425,300, filed Feb. 14, 2024.
(Continued)

*Primary Examiner* — Lauren R Bell
(74) *Attorney, Agent, or Firm* — The Webb Law Firm

(57) ABSTRACT

The present disclosure relates to a display substrate, a display panel, a display device, and a manufacturing method of the display panel. The display substrate display substrate includes a display area, the display area including: a plurality of sides, wherein adjacent sides of the plurality of sides intersect to form a plurality of corners; a first display area having a first pixel density; and a second display area having a second pixel density lower than the first pixel density, wherein the second display area is located in at least one of the corners.

18 Claims, 4 Drawing Sheets

(51) Int. Cl.

| | |
|---|---|
| *H10K 59/124* | (2023.01) |
| *H10K 59/131* | (2023.01) |
| *H10K 59/80* | (2023.01) |
| *H10K 77/10* | (2023.01) |
| *H10K 102/00* | (2023.01) |

(52) U.S. Cl.
CPC ....... *H10K 59/131* (2023.02); *H10K 59/8722* (2023.02); *H10K 59/873* (2023.02); *H10K 59/8731* (2023.02); *H10K 77/111* (2023.02); *H10K 2102/311* (2023.02)

(58) Field of Classification Search
CPC . H01L 27/32; H01L 51/5237; H01L 51/5253; H01L 51/5256
See application file for complete search history.

(56) References Cited

U.S. PATENT DOCUMENTS

| | | | |
|---|---|---|---|
| 2016/0271914 A1 | 9/2016 | Xie | |
| 2016/0306472 A1 | 10/2016 | Park et al. | |
| 2018/0040851 A1 | 2/2018 | Sasaki | |
| 2019/0019849 A1 | 1/2019 | Zheng et al. | |
| 2019/0019966 A1 | 1/2019 | Jiang et al. | |
| 2019/0096975 A1 | 3/2019 | Park et al. | |
| 2020/0066809 A1 | 2/2020 | Liu | |
| 2020/0168836 A1 | 5/2020 | Yu | |
| 2020/0176696 A1 | 6/2020 | Dai | |
| 2020/0194725 A1 | 6/2020 | Qin et al. | |
| 2020/0203657 A1 | 6/2020 | Xiao et al. | |
| 2020/0312832 A1 | 10/2020 | Chi et al. | |
| 2020/0409419 A1 | 12/2020 | He et al. | |
| 2021/0104700 A1* | 4/2021 | Chen .................... | H10K 50/841 |
| 2021/0118865 A1 | 4/2021 | Ding et al. | |
| 2021/0143337 A1 | 5/2021 | Choi et al. | |
| 2021/0143370 A1 | 5/2021 | Choi et al. | |
| 2021/0376008 A1 | 12/2021 | Tan | |

FOREIGN PATENT DOCUMENTS

| | | | | | |
|---|---|---|---|---|---|
| CN | 107665637 | A | | 2/2018 | |
| CN | 108365124 | A | | 8/2018 | |
| CN | 108389884 | A | | 8/2018 | |
| CN | 108417608 | A | | 8/2018 | |
| CN | 108682751 | A | | 10/2018 | |
| CN | 108766977 | A | | 11/2018 | |
| CN | 109065577 | A | | 12/2018 | |
| CN | 109065760 | A | | 12/2018 | |
| CN | 109585492 | A | | 4/2019 | |
| CN | 109830518 | A | | 5/2019 | |
| CN | 109872631 | A | | 6/2019 | |
| CN | 109905502 | A | * | 6/2019 | |
| CN | 109935730 | A | * | 6/2019 | ......... H01L 27/3276 |
| CN | 109950421 | A | | 6/2019 | |
| CN | 109962092 | A | | 7/2019 | |
| CN | 209071332 | U | | 7/2019 | |
| CN | 110120463 | A | | 8/2019 | |
| CN | 110289292 | A | | 9/2019 | |
| CN | 110350014 | A | * | 10/2019 | ............. G09F 9/301 |
| CN | 110634937 | A | * | 12/2019 | ......... H01L 27/3244 |
| CN | 110767702 | A | | 2/2020 | |
| CN | 110767706 | A | | 2/2020 | |
| CN | 111524952 | A | | 8/2020 | |
| CN | 213242598 | U | | 5/2021 | |
| JP | 2006220923 | A | | 8/2006 | |
| JP | 2018022624 | A | | 2/2018 | |
| JP | 2020184426 | A | | 11/2020 | |
| WO | WO-2019200884 | A1 | * | 10/2019 | ......... H01L 27/3244 |
| WO | 2020001087 | A1 | | 1/2020 | |

OTHER PUBLICATIONS

JP 2021-572620, Notice of Reasons for Refusal, Aug. 6, 2024.
JP 2021-572620, Notice of Reasons for Refusal, Jul. 29, 2024.
U.S. Appl. No. 17/425,300, Office Action, Nov. 27, 2024.

* cited by examiner

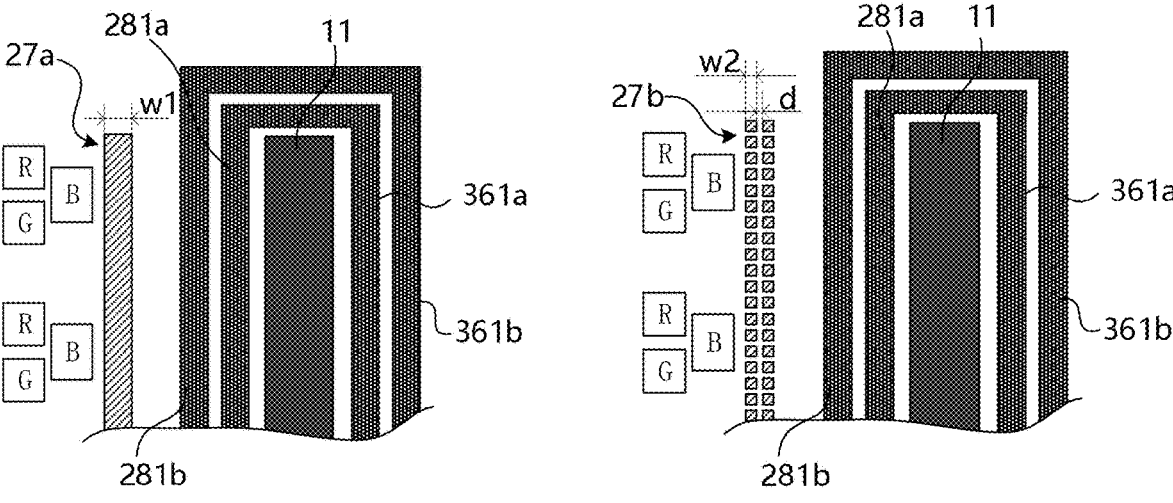
Fig. 8　　　　　　　　　　Fig. 9
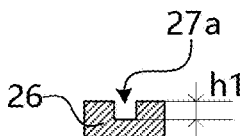
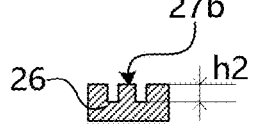
Fig. 10　　　　　　　　　　Fig. 11
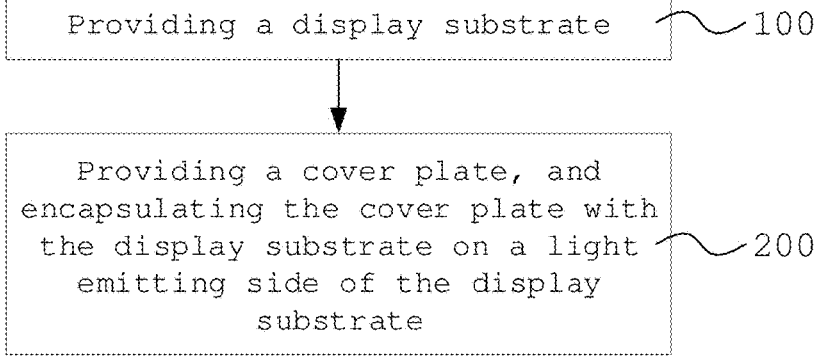
Fig. 12

DISPLAY SUBSTRATE, DISPLAY PANEL, DISPLAY DEVICE AND MANUFACTURING METHOD OF DISPLAY PANEL

CROSS-REFERENCE TO RELATED APPLICATION

This application is the United States national phase of International Application No. PCT/CN2020/089413 filed May 9, 2020, the disclosure of which is hereby incorporated by reference in its entirety.

TECHNICAL FIELD

The present disclosure relates to the field of display, and in particular to a display substrate, a display panel, a display device, and a manufacturing method of a display panel.

BACKGROUND

The organic light-emitting diode (referred to as OLED for short) has an organic compound film that emits light in response to current, wherein an organic material is interposed between two electrodes, and at least one electrode is a light-transmitting electrode. The OLED, which has a favorable light-emitting performance and efficiency, and requires a lower driving voltage, is a favorable priority for use as a display screen.

SUMMARY

In one aspect of the present disclosure, a display substrate is provided. The display substrate includes a display area, the display area including: a plurality of sides, wherein adjacent sides of the plurality of sides intersect to form a plurality of corners; a first display area having a first pixel density; and a second display area having a second pixel density lower than the first pixel density, wherein the second display area is located in at least one of the corners.

In some embodiments, the second display area includes: a stretchable base including a plurality of opening patterns distributed along a surface of the stretchable base, wherein each of the plurality of opening patterns includes a plurality of first openings, and a plurality of bridge areas configured to enclose an island area are formed between at least part of adjacent first openings among the plurality of first openings; a plurality of display units respectively arranged on island areas formed by respective opening patterns; and a plurality of wiring units respectively connected between the plurality of display units and respectively arranged in the plurality of bridge areas.

In some embodiments, at least one of the plurality of display units includes: a first planarization layer located on a front side of the stretchable base along a light emitting direction of the display substrate; a post spacer located on one side of the first planarization layer away from the stretchable base, and having a first groove; a first electrode layer located on one side of the first planarization layer away from the stretchable base and covering the post spacer; a first inorganic encapsulation layer located on one side of the first electrode layer away from the stretchable base and covering the first electrode layer; and a first organic encapsulation layer covering part of the first inorganic encapsulation layer located in the first groove and a part of the first groove on one side away from the first opening, and not covering part of the first inorganic encapsulation layer between the first groove and the first opening.

In some embodiments, the first groove includes a continuous groove extending along a length direction of the first opening.

In some embodiments, the continuous groove has a width of about 5 μm to about 15 μm and a height of about 1.5 μm to about 2.5 μm.

In some embodiments, the first groove includes at least one row of discrete grooves arranged along a direction perpendicular to a length direction of the first opening, and each row of discrete grooves includes a plurality of discrete grooves arranged at intervals along a length direction of the first opening.

In some embodiments, the plurality of discrete grooves have a width of about 5 μm to about 10 μm, and a height of about 1.5 μm to about 2.5 μm.

In some embodiments, the at least one row of discrete grooves includes a plurality of rows of discrete grooves, and a distance between adjacent rows of discrete grooves among the plurality of rows of discrete grooves is about 2 μm to about 7 μm.

In some embodiments, a distance between the first groove and the first opening is less than about 30 μm.

In some embodiments, at least one of the plurality of display units further includes: a first isolation structure located between the first groove and the first opening, and configured to disconnect the first electrode layers on both sides of the first isolation structure, wherein the first electrode layer covers the first isolation structure, and is located on one side of the first isolation structure adjacent to the first groove and one side of the first isolation structure adjacent to the first opening.

In some embodiments, at least one of the plurality of display units further includes: a first passivation layer located between the post spacer and the first opening, and at least part of the first passivation layer being located on one side of the first planarization layer away from the stretchable base; wherein the first isolation structure includes at least one second groove located in the first passivation layer and the first planarization layer, and the first electrode layer covering a bottom of the at least one second groove and the first electrode layer covering a surface of the first passivation layer are disconnected from each other.

In some embodiments, the at least one second groove has a width of about 3 μm to about 10 μm and a height of about 1000 nm to about 3000 nm.

In some embodiments, at least one of the plurality of display units further includes: an interlayer insulating layer located on a front side of the stretchable base along a light emitting direction of the display substrate; and wherein the first isolation structure includes at least one first bump located on a surface of the interlayer insulating layer on one side away from the stretchable base, the first electrode layer covers a top of the at least one first bump and part of a surface of the interlayer insulating layer, the first electrode layer on the top of the at least one first bump and the first electrode layer on the surface of the interlayer insulating layer are disconnected from each other.

In some embodiments, the at least one first bump has a width of about 3 μm to about 10 μm, and a height of about 400 nm to about 800 nm.

In some embodiments, at least one of the plurality of wiring units includes: a second planarization layer located on a front side of the stretchable base along a light emitting direction of the display substrate; a pixel definition layer located on one side of the second planarization layer away from the stretchable base, covering part of a surface of the second planarization layer, and having at least one third groove; and a second electrode layer covering a bottom of the at least one third groove, a surface of the pixel definition layer and part of a surface of the second planarization layer that is not covered by the pixel definition layer; wherein the second electrode layer covering the bottom of the at least one third groove and the second electrode layer covering the surface of the pixel definition layer are disconnected from each other.

In some embodiments, the number of third grooves in the at least one third groove is equal to the number of second grooves in the at least one second groove, and the at least one third groove and the at least one second groove respectively communicate with each other to form a closed ring around the first opening.

In some embodiments, at least one of the plurality of wiring units includes: a gate insulating layer located on a front side of the stretchable base along a light emitting direction of the display substrate; at least one second bump located on a surface of the gate insulating layer on one side away from the stretchable base; and a second electrode layer covering a top of the at least one second bump and part of a surface of the gate insulating layer that is not covered by the at least one second bump, wherein the second electrode layer covering the top of the at least one second bump and the second electrode layer covering the surface of the gate insulating layer are disconnected from each other.

In some embodiments, the number of second bumps in the at least one second bump is equal to the number of first bumps in the at least one first bump, and the at least one second bump and the at least one first bump respectively communicate with each other to form a closed ring around the first opening.

In some embodiments, an opening width of at least one of the plurality of first openings gradually decreases along a light emitting direction of the display substrate, and at least part of a sidewall of the at least one first opening of the plurality of first openings forms an included angle with a plane in which a surface of the stretchable base, on one side away from the plurality of display units and the plurality of wiring units, lies.

In some embodiments, the included angle is about 50° to about 80°.

In some embodiments, at least one of the plurality of wiring units includes: at least one inorganic encapsulation layer located on a front side of the stretchable base along a light emitting direction of the display substrate; and an organic coating located on a front side of the inorganic encapsulation layer farthest away from the stretchable base in the at least one inorganic encapsulation layer along a light emitting direction of the display substrate, and having a coating pattern.

In some embodiments, the coating pattern includes at least one second opening having a length direction parallel to a length direction of an adjacent first opening.

In one aspect of the present disclosure, a display panel is provided. The display panel includes: the display substrate described above; and a cover plate located on a light emitting side of the display substrate and encapsulated with the display substrate.

In one aspect of the present disclosure, a display device is provided. The display device includes: the display panel described above.

In one aspect of the present disclosure, a manufacturing method of a display panel is provided. The method includes the steps of: providing a display substrate, wherein the display substrate has a display area, the display area includes a plurality of sides, wherein adjacent sides of the plurality of sides intersect to form a plurality of corners, and the display area includes a first display area with a pixel density and a second display area with a second pixel density lower than the first pixel density, and the second display area is located in at least one of the plurality of corners; providing a cover plate, and encapsulating the cover plate with the display substrate on a light emitting side of the display substrate.

BRIEF DESCRIPTION OF THE DRAWINGS

The accompanying drawings, which constitute part of this specification, illustrate exemplary embodiments of the present disclosure and, together with this specification, serve to explain the principles of the present disclosure.

The present disclosure may be more clearly understood from the following detailed description with reference to the accompanying drawings, in which:

FIGS. 8 and 9 are respectively schematic views of the arrangement of the island area, the first opening and the bridge area in some embodiments of the display panel according to the present disclosure;

FIGS. 10 and 11 are respectively schematic cross-sectional views of the first groove in some embodiments of the display panel according to the present disclosure;

FIG. 12 is a schematic flowchart of an embodiment of a manufacturing method of the display panel according to the present disclosure.

Figure 1:
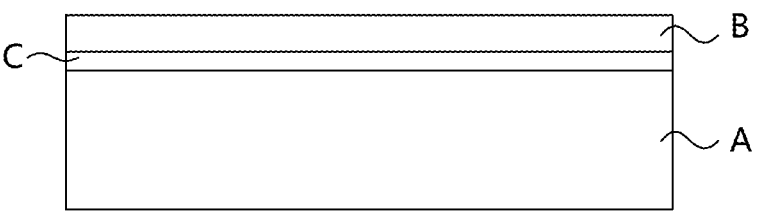
FIG. 1 is a schematic structural view of an embodiment of the display panel according to the present disclosure.

It should be understood that the sizes of the various parts shown in the accompanying drawings are not drawn according to the actual scale. In addition, the same or similar reference signs are used to denote the same or similar components.

DETAILED DESCRIPTION

Various exemplary embodiments of the present disclosure will now be described in detail with reference to the accompanying drawings. The description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The words "first", "second", and similar words used in the present disclosure do not denote any order, quantity or importance, but merely serve to distinguish different parts. Such similar words as "comprising" or "including" mean that the element preceding the word encompasses the elements enumerated after the word, and does not exclude the possibility of encompassing other elements as well. The terms "up", "down", "left", "right", or the like are used only to represent a relative positional relationship, and the relative positional relationship may be changed correspondingly if the absolute position of the described object changes.

In the present disclosure, when it is described that a particular device is located between the first device and the second device, there may be an intermediate device between the particular device and the first device or the second device, and alternatively, there may be no intermediate device. When it is described that a particular device is connected to other devices, the particular device may be directly connected to said other devices without an intermediate device, and alternatively, may not be directly connected to said other devices but with an intermediate device.

All the terms (including technical and scientific terms) used in the present disclosure have the same meanings as understood by those skilled in the art of the present disclosure unless otherwise defined. It should also be understood that terms as defined in general dictionaries, unless explicitly defined herein, should be interpreted as having meanings that are consistent with their meanings in the context of the relevant art, and not to be interpreted in an idealized or extremely formalized sense.

In the present disclosure, the term "about" refers to a numerical range and/or value that are/is substantially the same as those value ranges and/or values listed herein within the allowable process errors and measurement error ranges.

Techniques, methods, and apparatus known to those of ordinary skill in the relevant art may not be discussed in detail, but where appropriate, these techniques, methods, and apparatuses should be considered as part of this specification.

In some related technologies, the flexible OLED uses a polymer material as a protective cover, and the formed OLED device is not fragile. The inventors have found through research that some OLED flexible display devices are present with a black margin phenomenon at the four corners, which affects the user's visual experience.

In view of this, the embodiments of the present disclosure provide a display substrate, a display panel, a display device, and a manufacturing method of the display panel, which can improve the user's visual experience.

Figure 2:
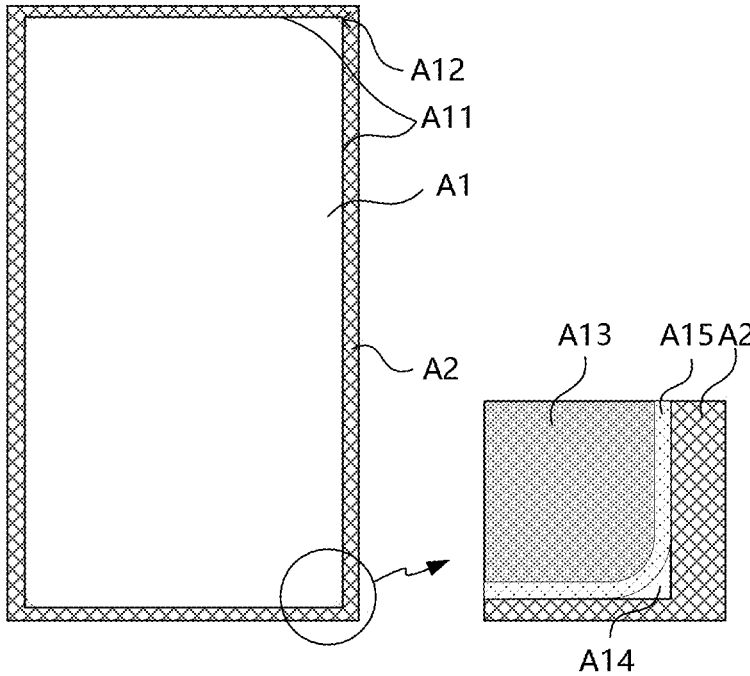
FIG. 2 is a schematic view of the layout of a display substrate in an embodiment of the display panel according to the present disclosure.

FIG. 1 is a schematic structural view of an embodiment of the display panel according to the present disclosure. FIG. 2 is a schematic view of the layout of a display substrate in an embodiment of the display panel according to the present disclosure.

Referring to FIGS. 1 and 2, in some embodiments, the display panel includes: a display substrate A and a cover plate B. The cover plate B is located on a front side of the display substrate A along a light emitting direction of the display substrate A, that is, the cover plate B is on a light emitting side of the display substrate A. The display substrate A and the cover plate B may be encapsulated by an encapsulant adhesive C (such as optical clear adhesive or the like). In FIG. 2, the display substrate A has a display area A1 and a non-display area A2 surrounding the display area A1. The display substrate A may be encapsulated with the cover plate B in the non-display area A2. The material of the cover plate B may be a rigid or flexible material, such as a glass or a colorless polyimide (referred to as CPI for short) film.

Referring to FIG. 2, the display area A1 includes a plurality of sides A11, wherein adjacent sides A11 of the plurality of sides A11 intersect to form a plurality of corners A12. In FIG. 2, the display area A1 has two groups of opposite sides A11, and the adjacent sides A11 are perpendicular to each other. Accordingly, the display area A1 has four corners A12. The display area A1 includes a first display area A13 having a first pixel density and a second display area A14 having a second pixel density. The second pixel density is lower than the first pixel density.

The pixel density of the transition area A15 between the first display area A13 and the second display area A14 may be equal to the first pixel density or the second pixel density, or located between the first pixel density and the second pixel density. The pixel density here refers to the number of pixels per unit area.

Referring to FIG. 2, in some embodiments, the second display area A14 is located in at least one of the plurality of corners A12. In FIG. 2, a second display area A14 is provided in each of the four corners A12. Considering that the corners of the display substrate and the cover plate are filled and encapsulated with organic ink therebetween in some related technologies, which results in a black margin appearing at the corners, in this embodiment, a second display area having a pixel density lower than that of the first display area is provided in the corners, which on one hand, may realize the image display at the corners, thereby increasing the screen-to-body ratio, and reducing the display frame, and further allowing the user to obtain a better visual experience, and on the other hand, can also reduce the difficulty in the machining process of the corners.

Figure 3:
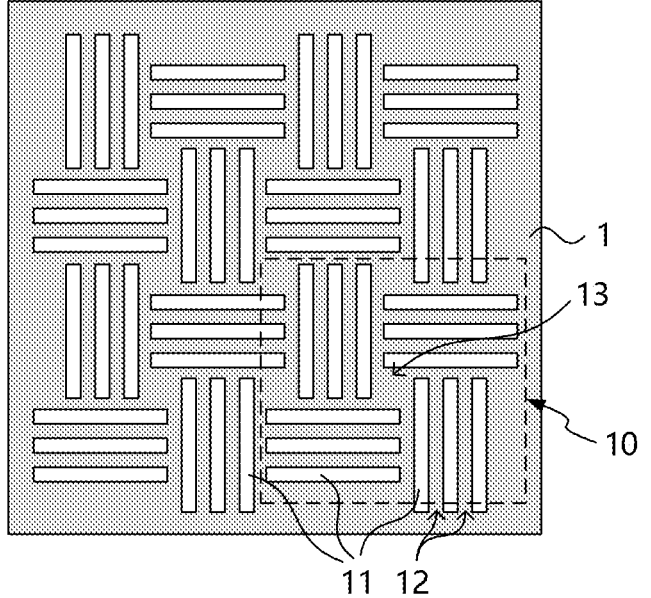
FIG. 3 is a schematic view of a plurality of opening patterns distributed along the surface of a stretchable base in an embodiment of the display panel according to the present disclosure.
Figures 4, 5:
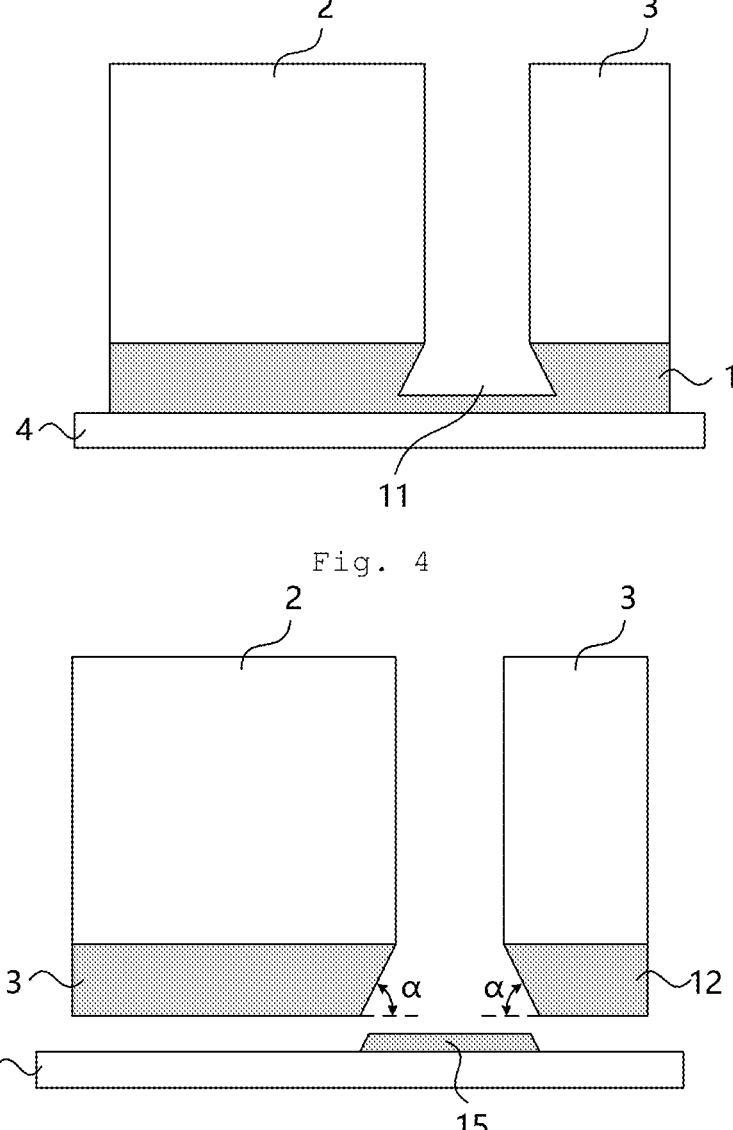
FIG. 4 is a schematic structural view of forming a portion of the display substrate corresponding to a second display area on the glass substrate in an embodiment of the display panel according to the present disclosure.
FIG. 5 is a schematic structural view of disengaging a portion of the display substrate corresponding to the second display area from the glass substrate in an embodiment of the display panel according to the present disclosure.

FIG. 3 is a schematic view of a plurality of opening patterns distributed along the surface of a stretchable base in an embodiment of the display panel according to the present disclosure. FIG. 4 is a schematic structural view of forming a portion of the display substrate corresponding to a second display area on the glass substrate in an embodiment of the display panel according to the present disclosure. FIG. 5 is a schematic structural view of disengaging a portion of the display substrate corresponding to the second display area from the glass substrate in an embodiment of the display panel according to the present disclosure.

Referring to FIGS. 3 to 5, in some embodiments, the second display area A14 includes: a stretchable base 1, a plurality of display units 2 and a plurality of wiring units 3. The stretchable base 1 may be made from a flexible material, such as polyimide (PI). Referring to FIG. 3, the stretchable base 1 includes a plurality of opening patterns 10 distributed along the surface of the stretchable base 1 (for example, the opening pattern formed by a plurality of openings within a dashed block in FIG. 3). Each opening pattern 10 among the plurality of opening patterns 10 includes a plurality of first openings 11, wherein a plurality of bridge areas 12 configured to enclose an island area 13 are formed between at least some adjacent first openings 11 among the plurality of first openings 11. A plurality of opening patterns 10 are arranged in the stretchable base 1, so that the stretchable display of the second display area A14 may be realized. By way of the stretchable display of the second display area, it is possible to allow that the corners of the display area of the display substrate are more closely attached to the cover plate, thereby reducing or avoiding the conditions such as air bubbles that affect the attachment between the corners and the cover plate during encapsulation.

In FIG. 3, three first openings 11 are respectively provided around the island area 13 of the opening pattern 10, and two bridge areas 12 can be formed between adjacent first openings 11 of the three first openings 11. In other embodiments, the positions of the first openings 11 around the island area 13 relative to the island area 13 and the number of the first openings 11 are not limited to the circumstances shown in FIG. 3. The first opening 11 may have a width of about 15 μm to about 25 μm. Referring to FIG. 4, in some embodiments, a plurality of display units 2 are respectively arranged on the island area 13 formed by each opening pattern 10, and a plurality of wiring units 3 are respectively connected between the plurality of display units 2, and respectively arranged in the plurality of bridge areas 12. The display unit 2 has display sub-pixels (for example, RGB sub-pixels) and driving circuits, and can realize image display. The plurality of display units 2 are connected through the plurality of wiring units 3 respectively.

Referring to FIGS. 4 and 5, in some embodiments, the display substrate A is firstly formed on the glass substrate 4, and then the display substrate A is peeled from the glass substrate 4 after forming the display substrate. During the process of forming the display substrate, the entire film layer is bored at a corresponding position of the first opening 11, and the entire surface is coated (for example, the electrode layer and the inorganic encapsulation layer of the display substrate, or the like) at a corresponding position of the island area 13, the bridge area 12 and the first opening 11.

When the display substrate A is peeled (for example, peeled by laser), it is found through research that there is a risk of peeling of a film layer and crack of a local irregular film layer between the film layer located in the first opening 11 and the film layer located in the island area during peeling by laser. To solve such process risk, in FIG. 4, an opening is made in the display substrate A at a position corresponding to the first opening 11 along a direction perpendicular to the display substrate, and then the film layers such as the electrode layer and the inorganic encapsulation layer are evaporated on the entire surface, so that there are also film layers such as the electrode layer and the inorganic encapsulation layer within the first opening 11.

In some embodiments, the opening width of at least one of the plurality of first openings 11 gradually decreases along a light emitting direction of the display substrate A. That is, a first opening shape with a narrow top and a wide bottom is formed. At least part of the sidewall of the first opening 11 form an included angle α with a plane in which the surface of the stretchable base 1, on one side away from the plurality of display units and the plurality of wiring units, lies. For example, part or entirety of the sidewall of the first opening 11 on one side away from the cover plate B form an included angle α with the bottom surface of the stretchable base 1.

In some embodiments, the included angle α is about 50° to about 80°. After verification of peeling by laser, such opening shape can make the opening wall on one side adjacent to the island area 13 and the opening wall on one side adjacent to the bridge area 12 within the first opening 11 both form a relatively flat section during peeling, thereby effectively improving the process. After peeling, the film layer 15 at the bottom of the first opening 11 remains on the glass substrate 4. The flat section here means that there is a relatively flat disconnected part between the opening walls on both sides of the first opening 11 and the film layer 15, without a rugged section resulting from peeling of a local film layer or crack of an irregular film layer.

Figure 6:
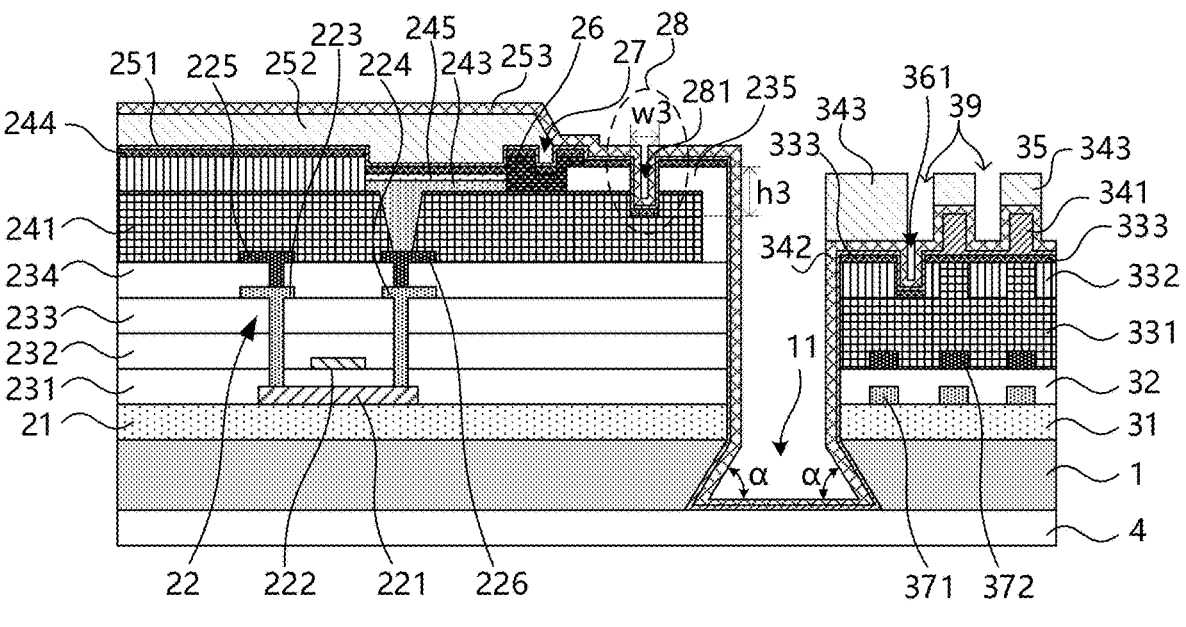
FIGS. 6 and 7 are respectively structural schematic views of forming a portion of the display substrate corresponding to the second display area on the glass substrate in some embodiments of the display panel according to the present disclosure.
Figure 7:
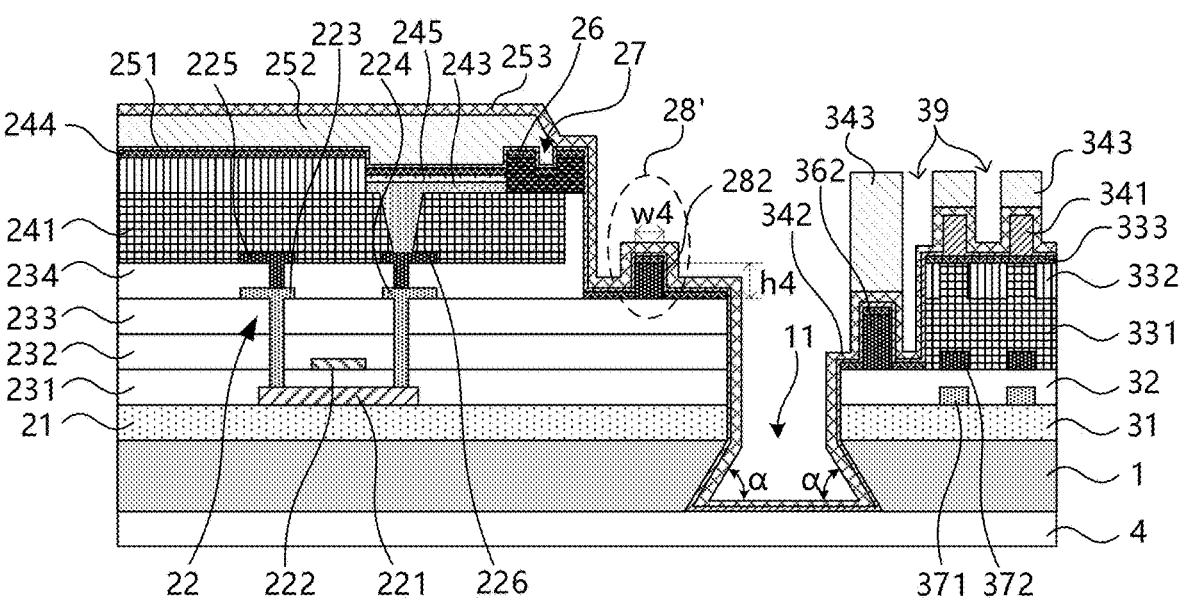

FIGS. 6 and 7 are respectively structural schematic views of forming a portion of the display substrate corresponding to the second display area on the glass substrate in some embodiments of the display panel according to the present disclosure. FIGS. 8 and 9 are respectively schematic views of the arrangement of the island area, the first opening and the bridge area in some embodiments of the display panel according to the present disclosure. FIGS. 10 and 11 are respectively schematic cross-sectional views of the first groove in some embodiments of the display panel according to the present disclosure.

Referring to FIGS. 6 and 7, in some embodiments, at least one of the plurality of display units 2 includes: a thin film transistor 22, a first planarization layer 241, a third electrode layer 243, a post spacer (referred to as PS for short) 26, a first organic light emitting layer 245, a first electrode layer 244, a first inorganic encapsulation layer 251, a first organic encapsulation layer 252, and a second inorganic encapsulation layer 253.

In FIGS. 6 and 7, the thin film transistor 22 is disposed on the stretchable base 1. The thin film transistor 22 includes an active layer 221, a gate 222, a first source 223, a first drain 224, a second source 225, and a second drain 226. The first source 223 and the first drain 224 are electrically connected to the active layer 221 through a via hole, and the second source 225 and the second drain 226 are respectively electrically connected to the first source 223 and the first drain 224 through a via hole. The thin film transistor 22 is not limited to the structural forms shown in FIGS. 6 and 7. In other embodiments, other structural forms may also be used. For example, the thin film transistor includes a single-layer source and drain.

The first planarization layer 241 is located on a front side of the stretchable base 1 along a light emitting direction of the display substrate, that is, on one side of the stretchable base 1 adjacent to the cover plate B. Specifically, the first planarization layer 241 is located on one side of the thin film transistor 22 away from the stretchable base 1, and covers the thin film transistor 22. The first planarization layer 241 may be configured to provide a flat surface for the formation of the upper film layer.

The post spacer 26 is located on one side of the first planarization layer 241 away from the stretchable base 1, and has a first groove 27. The third electrode layer 243 is located on one side of the first planarization layer 241 away from the stretchable base 1, and electrically connected to the thin film transistor 22 through a via hole.

The first organic light emitting layer 245 is located on one side of the third electrode layer 243 away from the stretchable base 1. The first electrode layer 244 is located on one side of the first organic light emitting layer 245 away from the stretchable base 1, and covers the post spacer 26. The first electrode layer 244 also covers the first organic light emitting layer 245.

In some embodiments, the third electrode layer 243 is an anode layer, and the first electrode layer 244 is a cathode layer. The third electrode layer 243, the first organic light emitting layer 245, and the first electrode layer 244 may form a light emitting element driven by the thin film transistor 22. In the island area, different colors of sub-pixels may be realized according to different materials used in the first organic light-emitting layer 245.

Referring to FIGS. 6 and 7, in some embodiments, the first inorganic encapsulation layer 251 is located on one side of the first electrode layer 244 away from the stretchable base 1, and covers the first electrode layer 244. The first organic encapsulation layer 252 is located on one side of the first inorganic encapsulation layer 251 away from the stretchable base 1. The second inorganic encapsulation layer 253 is located on one side of the first organic encapsulation layer 252 away from the stretchable base 1, and covers the first organic encapsulation layer 252 and the first inorganic encapsulation layer 251.

In order to ensure that the sub-pixels at a position adjacent to the first opening in the island area can emit light and prevent material failure and electrode corrosion, it is possible to perform encapsulation protection by a plurality of encapsulation layers. The first inorganic encapsulation layer 251 and the second inorganic encapsulation layer 253 may be formed by plasma enhanced chemical vapor deposition, and the first organic encapsulation layer 252 may be formed by printing. In order to avoid a risk of forming water and oxygen erosion paths between the outside and the first organic light-emitting layer 245, and between the outside and the first electrode layer 244 resulting from the organic material (such as organic ink) for printing the first organic encapsulation layer 252 overflowing into the first opening, the first groove 27 provided on the post spacer 26 may implement controlling an edge position of the organic material.

The first groove 27 is disposed on one side of the post spacer 26 away from the stretchable base 1 to block overflow of the organic material forming the first organic encapsulation layer 252. In this way, the first organic encapsulation layer 252 may cover part of the first inorganic encapsulation layer 251 located in the first groove 27 and part of the first groove 27 located away from the first opening 11, instead of covering part of the first inorganic encapsulation layer 251 between the first groove 27 and the first opening 11.

The position of the first groove 27 may be determined according to the pitch and arrangement manner of the sub-pixels within the island area. In some embodiments, the distance between the first groove and the first opening 11 is less than about 30 μm.

In FIGS. 6 and 7, the first groove 27 may be completed through an exposure and development process. When an organic material is printed, after the organic material flows to the first groove 27, it is not easily to continue to overflow to one side of the first groove 27 adjacent to the first opening.

Referring to FIG. 8, in some embodiments, the first groove 27 includes a continuous groove 27a extending along a length direction of the first opening 11. Referring to FIGS. 8 and 10, the continuous groove 27a has a width w1 of about 5 μm to about 15 μm, and a height h1 of about 1.5 μm to about 2.5 μm. The width w1 here refers to the size of the continuous groove 27a in the post spacer 26 along a direction perpendicular to the first opening 11, and the height h1 refers to the size of the continuous groove 27a in the post spacer 26 along a direction perpendicular to the stretchable base 1.

Referring to FIG. 9, in some embodiments, the first groove 27 includes at least one row of discrete grooves 27b arranged along a direction perpendicular to the length direction of the first opening 11, wherein each row of discrete grooves 27b includes a plurality of discrete grooves 27b arranged at intervals along the length direction of the first opening 11. Referring to FIGS. 9 and 11, the plurality of discrete grooves 27b has a width w2 of about 5 μm to about 10 μm, and a height h2 of about 1.5 μm to about 2.5 μm. The width w2 here refers to the size of each discrete groove 27b in the post spacer 26 along a direction perpendicular to the first opening 11, and the height h2 refers to the size of each discrete groove 27b in the post spacer 26 along a direction perpendicular to the stretchable base 1.

In FIG. 9, at least one row of discrete grooves 27b includes a plurality of rows of discrete grooves 27b (for example, two rows of discrete grooves). The distance d between adjacent rows of discrete grooves 27b among the plurality of rows of discrete grooves 27b is about 2 μm to about 7 μm. The spacing d here refers to the distance between the adjacent rows of discrete grooves 27b in the post spacer 26 along a direction perpendicular to the first opening 11.

In the manufacturing process of some embodiments of the display panel, some film layers (for example, organic light-emitting layer or electrode layer) are formed by plating the entire surface within the second display area. Accordingly, in order to prevent a failure risk resulting from the film layer corresponding to the first opening in communication with the film layer corresponding to the island area, in some embodiments, a first isolation structure is provided between the first groove 27 and the first opening 11 to achieve the isolation effect of the film layer.

Referring to FIGS. 6 and 7, in some embodiments, at least one of the plurality of display units 2 further includes first isolation structures 28, 28'. The first isolation structure 28, 28' is located between the first groove 27 and the first opening 11, and configured to disconnect the first electrode layer 244 on both sides of the first isolation structure 28, 28', so as to increase a transverse effective encapsulation distance. The first electrode layer 244 is covered on the first isolation structure 28, 28', and located on one side of the first isolation structure 28, 28' adjacent to the first groove and one side adjacent to the first opening 11.

Referring to FIG. 6, at least one of the plurality of display units 2 further includes: a first passivation layer 235. The first passivation layer 235 is located between the post spacer 26 and the first opening 11, and at least part of the first passivation layer 235 is located on one side of the first planarization layer 241 away from the stretchable base 1. In addition, at least one of the plurality of display units 2 may further include a first buffer layer 21, a first gate insulating layer 231, a second gate insulating layer 232, an interlayer insulating layer 233, and a second passivation layer 234.

It is found through research that when the first inorganic encapsulation layer and the second inorganic encapsulation layer are formed by a plasma film forming process, the lateral film layer formed at a position of the first planarization layer adjacent to the first opening (that is, a portion of the first inorganic encapsulation layer and the second inorganic encapsulation layer located on the first opening sidewall) is relatively thin due to a large height difference, and the water vapor from the side of the first opening 11 might enter devices such as the thin film transistor via the first planarization layer from a thin lateral film layer, thereby causing failure of the device.

In FIG. 6, the first passivation layer 235 includes a first portion located on one side of the first planarization layer 241 away from the stretchable base 1, and a second portion located on one side of the first planarization layer 241 adjacent to the first opening 11. The second portion is connected to the surface of the second passivation layer 234 to form the isolation protection of the first passivation layer 235 on the surface of the first planarization layer 241 on one side adjacent to the first opening 11, thereby reducing or avoiding a risk of water vapor from the side of the first opening 11 entering devices such as the thin film transistor through the first planarization layer. In some embodiments, the material of the first passivation layer 235 is the same as that of the second passivation layer 234 so as to achieve a more tight engagement therebetween.

The first buffer layer 21 is located on one side of the stretchable base 1 adjacent to the first planarization layer 241. The first gate insulating layer 231 is located on one side of the first buffer layer 21 away from the stretchable base 1, and covers the active layer 221 of the thin film transistor 22. The second gate insulating layer 232 is located on one side of the first gate insulating layer 231 away from the stretchable base 1, and covers the gate 222 of the thin film transistor 22.

The interlayer insulating layer 233 is located on one side of the second gate insulating layer 232 away from the stretchable base 1. The second passivation layer 234 is located between the interlayer insulating layer 233 and the first planarization layer 241. The first passivation layer 235 is located on one side of the first planarization layer 241 away from the stretchable base 1, and located between the post spacer 26 and the first opening 11.

The gate 222 of the thin film transistor 22 is located on the surface of one side of the first gate insulating layer 231 away from the stretchable base 1. The first source 223 and the first drain 224 of the thin film transistor 22 are located on the surface of one side of the interlayer insulating layer 233 away from the stretchable base 1, and electrically connected to the active layer 221 through a via hole penetrating the first gate insulating layer 231, the second gate insulating layer 232 and the interlayer insulating layer 233. The second source 225 and the second drain 226 of the thin film transistor 22 are located on the surface of one side of the second passivation layer 234 away from the stretchable base 1, and electrically connected to the first source 223 and the first drain 224 of the thin film transistor 22 respectively through a via hole penetrating the second passivation layer 234. In other embodiments, the display unit 2 includes only the first gate insulating layer 231, but not the second gate insulating layer 232. In other embodiments, the thin film transistor 22 includes a single-layer source and drain.

In FIG. 6, the first isolation structure 28 includes at least one second groove 281 located in the first passivation layer 235. The first electrode layer 244 covering the bottom of the at least one second groove 281 and the first electrode layer 244 covering the surface of the first passivation layer 235 are disconnected from each other. Referring to FIG. 6, the at least one second groove 281 has a width w3 of about 3 μm to about 10 μm, and a height h3 of about 1000 nm to about 3000 nm. The width w3 here refers to the size of each second groove 281 along a direction perpendicular to the first opening 11, and the height h3 refers to the size of each second groove 281 along a direction perpendicular to the stretchable base 1.

Referring to FIG. 6, in some embodiments, at least one of the plurality of wiring units 3 includes: a second planarization layer 331, a pixel definition layer 332 and a second electrode layer 333. The second planarization layer 331 is located on a front side of the stretchable base 1 along a light emitting direction of the display substrate, that is, on one side of the stretchable base 1 adjacent to the cover plate B. The pixel definition layer 332 is located on one side of the second planarization layer 331 away from the stretchable base 1, covers part of the surface of the second planarization layer 331, and has at least one third groove 361.

In FIG. 6, at least one of the plurality of wiring units 3 further includes: a second buffer layer 31, a first conductive wiring 371, a gate insulating layer 32 and a second conductive wiring 372. The second buffer layer 31 is located on the surface of the stretchable base 1. The first conductive wiring

371 is located on the surface of the second buffer layer 31 on one side away from the stretchable base 1. The gate insulating layer 32 is located on one side of the second buffer layer 31 away from the stretchable base 1, and covers the first conductive wiring 371. The second conductive wiring 372 is located on the surface of one side of the gate insulating layer 32 away from the stretchable base 1.

In FIG. 6, the second planarization layer 331 is located on one side of the second conductive wiring 372 away from the stretchable base 1, and covers the second conductive wiring 372. At least one third groove 361 is disposed adjacent to the first opening 11. In addition, the second electrode layer 333 covers the bottom of the at least one third groove 361, the surface of the pixel definition layer 332, and part of the surface of the second planarization layer 331 that is not covered by the pixel definition layer 332.

The second electrode layer 333 covering the bottom of the at least one third groove 361 and the second electrode layer 333 covering the surface of the pixel defining layer 332 are disconnected from each other, so that the second electrode layer 333 located in the bridge area is partitioned from the second electrode layer 333 corresponding to the first opening 11, so as to prevent the film layer corresponding to the first opening from communicating with the film layer corresponding to the island area via the film layer corresponding to the bridge area.

In the foregoing embodiments shown in FIGS. 4 and 5, the display substrate is formed on the glass substrate 4, and then peeled by laser. Accordingly, in some embodiments, the corresponding film layers respectively provided in the island area and the bridge area may be located in the same layer and have the same material to simplify the process. The same material in the same layer here and later may be a layer structure formed by using the same film forming process to form a film layer for forming a specific pattern, and then using the same mask plate to pattern the film layer through a single patterning process. Depending on different specific patterns, a single patterning process may include a plurality of exposure, development or etching processes, and the specific pattern in the formed layer structure may be continuous or discontinuous. These specific patterns might also be at different heights or have different thicknesses.

For example, the second buffer layer 31 and the first buffer layer 21 are located in the same layer and have the same material. The first conductive wiring 371 and part of the sources and drains of the thin film transistor 22 (for example, the first source 223 and the first drain 224) are located in the same layer and have the same material, the second conductive wiring 372 and part of the sources and drains of the thin film transistor 22 (for example, the second source 225 and the second drain 226) are located in the same layer and have the same material, the second planarization layer 331 and the first planarization layer 241 are located in the same layer and have the same material, and the second electrode layer 333 and the first electrode layer 244 are located in the same layer and have the same material.

Referring to FIGS. 8 and 9, in some embodiments, the number of third grooves 361 in at least one third groove 361 is the same as the number of second grooves 281 in the at least one second groove 281. The at least one third groove 361 and the at least one second groove 281 respectively communicate with each other to form a closed ring around the first opening 11. In FIGS. 8 and 9, the two second grooves 281 (281a, 281b) of the first opening 11 on one side adjacent to the sub-pixel in the island area respectively communicate with the two third grooves 361 (361a, 361b) of the first opening 12 on one side adjacent to the bridge area.

Compared with the embodiment shown in FIG. 6, in FIG. 7, the first isolation structure 28' includes at least one first bump 282 located on the surface of the interlayer insulating layer 233 on one side away from the stretchable base 1. The first electrode layer 244 covers the top of the at least one first bump 282 and the surface of the interlayer insulating layer 233. The first electrode layer 244 located on the top of the at least one first bump 282 and the first electrode layer 244 located on the surface of the interlayer insulating layer 233 are disconnected from each other. Referring to FIG. 7, the at least one first bump has a width w4 of about 3 μm to about 10 μm, and a height h4 of about 400 nm to about 800 nm. The width w4 here refers to the size of each first bump 282 along a direction perpendicular to the first opening 11, and the height h4 refers to the size of each first bump 282 along a direction perpendicular to the stretchable base 1. The material of the first bump 282 may be a Ti—Al—Ti three-layer structure.

Accordingly, referring to FIG. 7, in some embodiments, at least one of the plurality of wiring units 3 includes: a gate insulating layer 32, at least one second bump 362 and a second electrode layer 333. The gate insulating layer 32 is located on a front side of the stretchable base 1 along a light emitting direction of the display substrate, that is, on one side of the stretchable base 1 adjacent to the cover plate B. At least one second bump 362 is located on the surface of one side of the gate insulating layer 32 away from the stretchable base 1.

In FIG. 7, at least one of the plurality of wiring units 3 may further include: a second buffer layer 31, a first conductive wiring 371, a second conductive wiring 372, a second planarization layer 331, and a pixel definition layer 332. The second buffer layer 31 is located on the surface of the stretchable base 1. The first conductive wiring 371 is located on the surface of one side of the second buffer layer 31 away from the stretchable base 1. The third gate insulating layer 32 is located on one side of the second buffer layer 31 away from the stretchable base 1, and covers the first conductive wiring 371. The second conductive wiring 372 is located on the surface of one side of the third gate insulating layer 32 away from the stretchable base 1.

The second planarization layer 331 is located on one side of the second conductive wiring 372 away from the stretchable base 1, and covers the second conductive wiring 372. The pixel definition layer 332 is located on one side of the second planarization layer 331 away from the stretchable base 1, and covers part of the surface of the second planarization layer 331.

At least one second bump 362 may be disposed adjacent to the first opening 11. The second electrode layer 333 covers the top of the at least one second bump 362 and part of the surface of the third gate insulating layer 32. The second electrode layer 333 covering the top of the at least one second bump 362 and the second electrode layer 333 covering the surface of the third gate insulating layer 32 are disconnected from each other, so that the second electrode layer 333 located in the bridge area is partitioned from the second electrode layer 333 corresponding to the first opening 11, so as to prevent the film layer corresponding to the first opening from communicating with the film layer corresponding to the island area via the film layer corresponding to the bridge area.

In some embodiments, the corresponding film layers respectively provided in the island area and the bridge area may be located in the same layer and have the same material. For example, the second buffer layer 31 and the first buffer layer 21 are located in the same layer and have the same material. The first conductive wiring 371 and part of the sources and drains of the thin film transistor 22 (for example, the first source 223 and the first drain 224) are located in the same layer and have the same material, the second conductive wiring 372 and part of the sources and drains of the thin film transistor 22 (for example, the second source 225 and the second drain 226) are located in the same layer and have the same material, the second planarization layer 331 and the first planarization layer 241 are located in the same layer and have the same material, and the second electrode layer 333 and the first electrode layer 244 are located in the same layer and have the same material.

Referring to FIGS. 8 and 9, in some embodiments, the number of second bumps 362 in the at least one second bump 362 is the same as the number of first bumps 282 in the at least one first bump 282, and respectively communicate with each other to form a closed ring around the first opening 11. The second bump 362 and the first bump 282 may be formed in the same patterning process.

Referring to FIGS. 6 and 7, in some embodiments, at least one of the plurality of wiring units 3 may include: at least one inorganic encapsulation layer and an organic coating 343. The at least one inorganic encapsulation layer is located on a front side of the stretchable base 1 along a light emitting direction of the display substrate, that is, on one side of the stretchable base 1 adjacent to the cover plate B. The organic coating 343 is located on a front side of the inorganic encapsulation layer farthest away from the stretchable base in the at least one inorganic encapsulation layer along a light emitting direction of the display substrate A, and has a coating pattern. In the case of meeting the reliability requirements of the product, it is possible not to provide other film layers between the organic coating 343 and the cover plate B, so that the display substrate can be flexibly attached to the cover plate at a position corresponding to the bridge area.

In FIGS. 6 and 7, the at least one inorganic encapsulation layer may include: a third inorganic encapsulation layer 341 and a fourth inorganic encapsulation layer 342. The third inorganic encapsulation layer 341 is located on one side of the second electrode layer 333 away from the stretchable base 1. The fourth inorganic encapsulation layer 342 is located on one side of the third inorganic encapsulation layer 341 away from the stretchable base 1. The organic coating 343 is located on one side of the fourth inorganic encapsulation layer 342 away from the stretchable base 1.

The third inorganic encapsulation layer 341 and the fourth inorganic encapsulation layer 342 may be formed by plasma enhanced chemical vapor deposition, and the organic coating 343 may be formed by coating. The material of the organic coating 343 may be 1-methoxy-2-propyl acetate, acrylic acid polymers, etc.

In some embodiments, the second electrode layer 333 and the first electrode layer 244 are located in the same layer and have the same material, and the third inorganic encapsulation layer 341 may be located in the same layer and have the same material as the first inorganic encapsulation layer 251. The encapsulation layer 342 may be located in the same layer and have the same material as the second inorganic encapsulation layer 253, so as to simplify the process.

In FIGS. 6 and 7, the coating pattern in the organic coating 343 includes at least one second opening 39, and the length direction of the at least one second opening 39 is parallel to the length direction of the adjacent first opening 11. In some embodiments, the coating pattern includes a plurality of second openings 39 parallel to each other. The second opening 39 of the coating pattern may be formed by an exposure and development process. With the second opening of the organic coating in the bridge area, the tensile properties of the bridge area can be effectively improved.

The above-mentioned embodiments of the display panel of the present disclosure are applicable to various display devices. Therefore, the present disclosure also provides a display device including the aforementioned display panel. The display device may be any product or component with a display function, such as a mobile phone, a tablet computer, a television, a monitor, a notebook computer, a digital photo frame, a navigator and the like.

FIG. 12 is a schematic flowchart of an embodiment of a manufacturing method of the display panel according to the present disclosure.

For the above-described embodiments of the display panel, it may be obtained by manufacturing with reference to the manufacturing method embodiment shown in FIG. 12. Referring to FIG. 12, in some embodiments, the method of manufacturing a display panel includes: step 100 and step 200. In step 100, a display substrate A is provided. The display substrate has a display area A1 and a non-display area A2 surrounding the display area A1. The display area A1 includes a plurality of sides A11, wherein adjacent sides A11 of the plurality of sides A11 intersect to form a plurality of corners A12, the display area A1 includes a first display area A13 with a first pixel density and a second display area A14 with a second pixel density lower than the first pixel density, and the second display area A14 is located in at least one of the plurality of corners A12. In step 200, a cover plate B is provided, and the cover plate is encapsulated with the display substrate A on a light emitting side of the display substrate A.

Multiple embodiments in the present description are described in a progressive manner, with different focuses for the respective embodiments which may be subjected to cross-reference for the same or similar portions. For the embodiments of the method, since the method as a whole and the steps involved are in a relationship corresponding to the content in the embodiments of the display panel, such embodiments are described in a relatively simple manner. The partial descriptions of the embodiments of the display panel may be referred thereto for the relevant aspects.

Hereto, various embodiments of the present disclosure have been described in detail. Some details well known in the art are not described to avoid obscuring the concept of the present disclosure. According to the above description, those skilled in the art would fully know how to implement the technical solutions disclosed herein. Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalently substitution of part of the technical features may be made without departing from the scope and spirit of the present disclosure. The scope of the present disclosure is defined by the appended claims.

What is claimed is:

1. A display substrate comprising:
a display area, wherein the display area comprises:
a plurality of sides, wherein adjacent sides of the plurality of sides intersect to form a plurality of corners;
a first display area having a first pixel density; and a second display area having a second pixel density lower than the first pixel density, wherein the second display area is located in at least one corner of the plurality of corners;
wherein the second display area comprises:
a stretchable base comprising a plurality of opening patterns distributed along the stretchable base, each opening pattern of the plurality of opening patterns comprises a plurality of first openings, a plurality of bridge areas, and an island area, wherein each first opening of the plurality of first openings is formed through the stretchable base; and
in each opening pattern of the plurality of opening patterns, each bridge area of the plurality of bridge areas is located between two adjacent first openings of the plurality of first openings, and the plurality of first openings and the plurality of bridge areas are arranged to surround the island area;
in each opening pattern of the plurality of opening patterns, a display unit is arranged on the island area and a wiring unit is arranged in each bridge area of the plurality of bridge areas;
wherein the display unit comprises:
a first planarization layer located on a front side of the stretchable base along a light emitting direction of the display substrate;
a post spacer located on one side of the first planarization layer away from the stretchable base, and having a first groove;
a first electrode layer located on the one side of the first planarization layer away from the stretchable base, and covering the post spacer;
a first inorganic encapsulation layer located on one side of the first electrode layer away from the stretchable base, covering the first electrode layer, and having a first part located in the first groove, a second part located on a first side of the first groove away from one first opening of the plurality of first openings, and a third part located on a second side of the first groove between the first groove and the one first opening of the plurality of first openings; and
a first organic encapsulation layer covering the part of the first inorganic encapsulation layer located in the first groove and covering the part of the first inorganic encapsulation layer located on the first side of the first groove away, the first organic encapsulation layer not covering the part of the first inorganic encapsulation layer located on the second side of the first groove.

2. The display substrate according to claim 1, wherein the first groove comprises a continuous groove extending along a length direction of the one first opening of the plurality of first openings.

3. The display substrate according to claim 2, wherein the continuous groove has a width of 5 μm to 15 μm and a height of 1.5 μm to 2.5 μm.

4. The display substrate according to and Currently Amended) The display substrate according to claim 1 wherein the first groove comprises at least one row of discrete grooves arranged along a direction perpendicular to a length direction of the one first opening of the plurality of first opening, and each row of discrete grooves of the at least one row of discreet grooves comprises a plurality of discrete grooves arranged at intervals along the length direction of the one first opening of the plurality of first opening.

5. The display substrate according to claim 4, wherein, in each row of discrete grooves of the at least one row of discreet grooves, the plurality of discrete grooves have a width of 5 μm to 10 μm, and a height of 1.5 μm to 2.5 μm.

6. The display substrate according to claim 1, wherein a distance between the first groove and the one first opening of the plurality of first openings is less than 30 μm.

7. The display substrate according to claim 1, wherein an opening width of the one first opening of the plurality of first openings gradually decreases along the light emitting direction of the display substrate, and at least part of a sidewall of the one first opening of the plurality of first opening forms an included angle with a plane in which a surface of the stretchable base away from the display unit and the wiring unit lies.

8. A display panel comprising:
the display substrate of claim 1; and
a cover plate located on a light emitting side of the display substrate.

9. A display device comprising:
the display panel according to claim 8.

10. The display substrate according to claim 1, wherein the display unit further comprises:
a first isolation structure located between the first groove and the one first opening of the plurality of first openings, and configured to disconnect the first electrode layer;
wherein the first electrode layer has a part located on a first side of the first isolation structure away from the one first opening of the plurality of first openings and a part located on a second side of the first isolation structure between the first isolation structure and the one first opening of the plurality of first opening.

11. The display substrate according to claim 10, wherein the display unit further comprises:
an interlayer insulating layer located on a front side of the stretchable base along light emitting direction of the display substrate; and
wherein the first isolation structure comprises at least one first bump located on a surface of the interlayer insulating layer on one side away from the stretchable base, the first electrode layer further comprise a first portion covering a top of the at least one first bump and a second portion covering part of a surface of the interlayer insulating layer, the first portion and the second portion are disconnected from each other.

12. The display substrate according to claim 11, wherein the wiring unit comprises:
a gate insulating layer located on a front side of the stretchable base along the light emitting direction of the display substrate;
at least one second bump located on a surface of the gate insulating layer on one side away from the stretchable base; and
a second electrode layer covering a top of the at least one second bump and part of the surface of the gate insulating layer that is not covered by the at least one second bump,
wherein a portion of the second electrode layer covering the top of the at least one second bump and a portion of the second electrode layer covering the part of the surface of the gate insulating layer are disconnected from each other.

13. The display substrate according to claim 10, wherein the display unit further comprises:
a first passivation layer located between the post spacer and the one first opening of the plurality of first openings, and at least part of the first passivation layer being located on the one side of the first planarization layer away from the stretchable base; and
wherein the first isolation structure comprises at least one second groove located in the first passivation layer and the first planarization layer, the first electrode layer comprises a first portion covering a bottom of the at least one second groove and a second portion covering a surface of the first passivation layer, and the first portion and the second portion are disconnected from each other.

14. The display substrate according to claim 13, wherein the at least one second groove has a width of 3 μm to 10 μm and a height of 1000 nm to 3000 nm.

15. The display substrate according to claim 13, wherein the wiring unit comprises:
a second planarization layer located on the front side of the stretchable base along the light emitting direction of the display substrate, a surface of the second planarization layer away from the stretchable base as a first part and a second part;
a pixel definition layer covering the first part of the surface of the second planarization layer and not covering the second part of the surface of the second planarization layer, the pixel definition layer having at least one third groove; and
a second electrode layer having a first part covering a bottom of the at least one third groove, a second part covering a surface of the pixel definition layer and a third part covering the second part of part of the surface of the second planarization layer,
wherein the first part of the second electrode layer and the second part of the second electrode layer are disconnected from each other.

16. The display substrate according to claim 15, wherein the number of third grooves in the at least one third groove is equal to the number of second grooves in the at least one second groove, and a third groove of the at least one third groove and a second groove of the at least one second groove respectively communicate with each other to form a closed ring around the one first opening of the plurality of first opening.

17. The display substrate according to claim 15, wherein the wiring unit comprises:
a third inorganic encapsulation layer, located on one side of the second electrode layer away from the stretchable base;
a fourth inorganic encapsulation layer, located on one side of the third inorganic encapsulation layer away from the stretchable base; and
an organic coating, located on one side of the fourth inorganic encapsulation layer away from the stretchable base, wherein the organic coating has a coating pattern.

18. A manufacturing method of a display panel comprising the steps of:
providing a display substrate,
providing a cover plate on a light emitting side of the display substrate, and
encapsulating the cover plate with the display substrate;
wherein the display substrate comprises:
a display area, wherein the display area comprises:
a plurality of sides, wherein adjacent sides of the plurality of sides intersect to form a plurality of corners;
a first display area having a first pixel density; and a second display area having a second pixel density lower than the first pixel density, wherein the second display area is located in at least one corner of the plurality of corners;

wherein the second display area comprises:

a stretchable base comprising a plurality of opening patterns distributed along the stretchable base, each opening pattern of the plurality of opening patterns comprises a plurality of first openings, a plurality of bridge areas, and an island area, wherein each first opening of the plurality of first openings is formed through the stretchable base; and in each opening pattern of the plurality of opening patterns, each bridge area of the plurality of bridge areas is located between two adjacent first openings of the plurality of first openings, and the plurality of first openings and the plurality of bridge areas are arranged to surround the island area;

in each opening pattern of the plurality of opening patterns, a display unit is arranged on the island area and a wiring unit is arranged in each bridge area of the plurality of bridge areas;

wherein the display unit comprises:

a first planarization layer located on a front side of the stretchable base along a light emitting direction of the display substrate;

a post spacer located on one side of the first planarization layer away from the stretchable base, and having a first groove;

a first electrode layer located on the one side of the first planarization layer away from the stretchable base, and covering the post spacer;

a first inorganic encapsulation layer located on one side of the first electrode layer away from the stretchable base, covering the first electrode layer, and having a first part located in the first groove, a second part located on a first side of the first groove away from one first opening of the plurality of first openings, and a third part located on a second side of the first groove between the first groove and the one first opening of the plurality of first openings; and a first organic encapsulation layer covering the part of the first inorganic encapsulation layer located in the first groove and covering the part of the first inorganic encapsulation layer located on the first side of the first groove away, the first organic encapsulation layer not covering the part of the first inorganic encapsulation layer located on the second side of the first groove.

* * * * *